United States Patent
Yoshida et al.

[11] Patent Number: 6,051,156
[45] Date of Patent: Apr. 18, 2000

[54] COMPOUND MAGNETIC MATERIAL AND ELECTROMAGNETIC INTERFERENCE SUPPRESSOR

[75] Inventors: Shigeyoshi Yoshida, Abiko; Mitsuharu Sato, Yokohama; Koji Kamei, Kawasaki, all of Japan

[73] Assignee: Tokin Corporation, Miyagi, Japan

[21] Appl. No.: 09/077,442

[22] PCT Filed: Sep. 24, 1997

[86] PCT No.: PCT/JP97/03396

§ 371 Date: May 28, 1998

§ 102(e) Date: May 28, 1998

[87] PCT Pub. No.: WO98/14962

PCT Pub. Date: Apr. 9, 1998

[30] Foreign Application Priority Data

Sep. 30, 1996 [JP] Japan ................................ 8-258302

[51] Int. Cl.[7] .......................... H01R 1/00; H01Q 17/00; H05K 9/00
[52] U.S. Cl. .................... 252/62.54; 252/62.55; 307/71
[58] Field of Search ............... 252/62.54, 62.55, 252/62.56, 62.59, 62.63; 367/91

[56] References Cited

U.S. PATENT DOCUMENTS

| | | | |
|---|---|---|---|
| 3,047,428 | 7/1962 | Goto et al. | 252/62.56 |
| 3,652,334 | 3/1972 | Abeck et al. | 252/62.56 |
| 4,585,568 | 4/1986 | Nagai et al. | 252/62.56 |
| 5,093,100 | 3/1992 | Sadamura et al. | 252/62.56 |
| 5,123,989 | 6/1992 | Horiishi et al. | 252/62.56 |

FOREIGN PATENT DOCUMENTS

| | | |
|---|---|---|
| 57-180206 | 11/1982 | Japan . |
| 62-213101 | 9/1987 | Japan . |
| 4-11624 | 1/1992 | Japan . |

*Primary Examiner*—C. Melissa Koslow
*Attorney, Agent, or Firm*—Hopgood, Calimafde, Kalil & Judlowe

[57] ABSTRACT

A thin electromagnetic interference suppressing body effective for electromagnetic interference suppression at a microwave band. As a material of the electromagnetic interference suppressing body, there is provided a composite magnetic body formed by bonding powder made of a semi-hard magnetic material by an organic bonding agent and having a high magnetic loss at the microwave band. As the semi-hard magnetic material, a metallic magnetic body, such as Fe—Co—Mo alloy, Co—Fe—Nb alloy or Fe—Co—V alloy, or an oxide magnetic body, such as $\gamma$-$Fe_2O_3$ or Co—Ti substituted Ba ferrite, can be used. Further, as an example of the organic bonding agent, polyurethane resin can be cited.

6 Claims, 2 Drawing Sheets

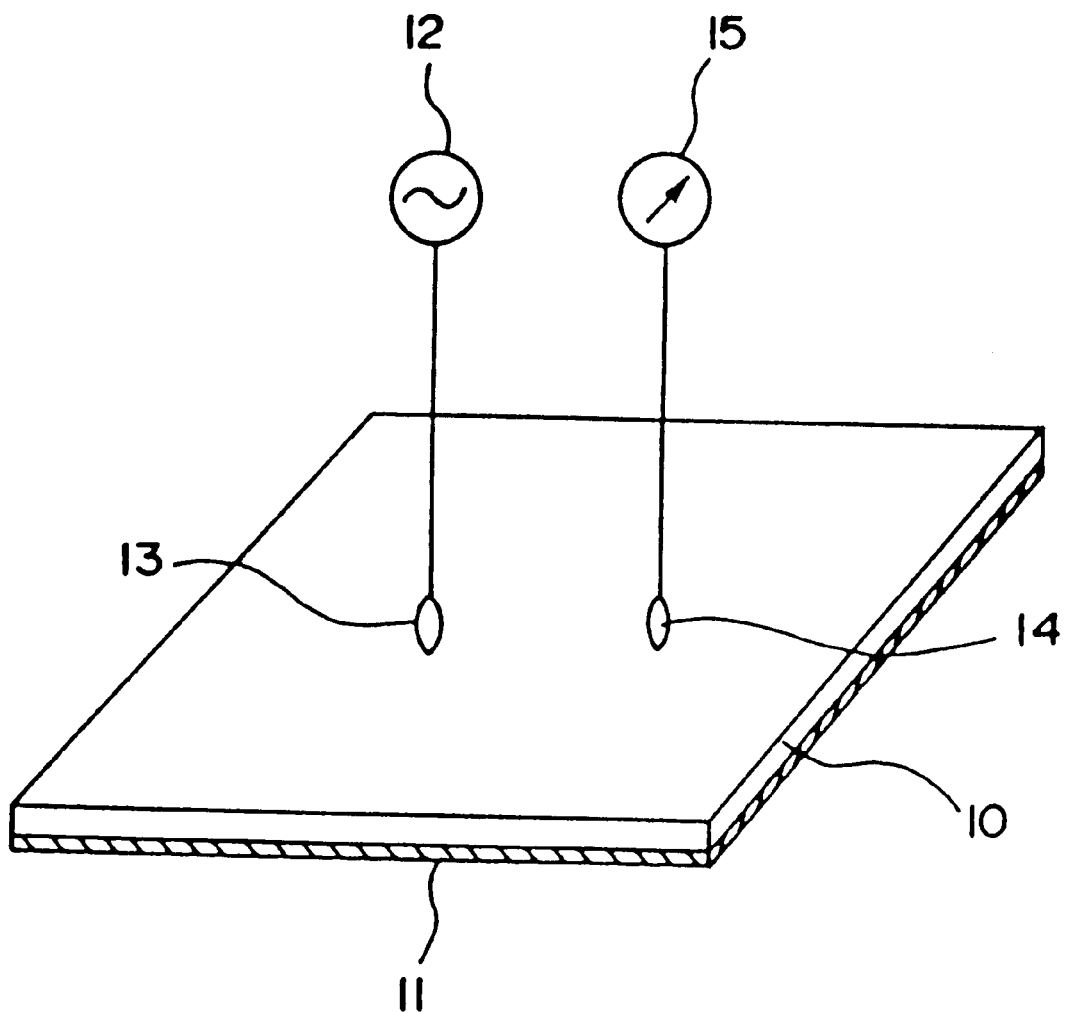

COMPOUND MAGNETIC MATERIAL AND ELECTROMAGNETIC INTERFERENCE SUPPRESSOR

TECHNICAL FIELD

The present invention relates to an electromagnetic interference suppressing body for a high frequency region, particularly, a microwave band, and in particular, to a composite magnetic material therefor.

BACKGROUND ART

In recent years, the spread of electronic devices, including digital electronic devices, using high frequency waves has been advanced and, among them, the spread of mobile communication devices using quasi-microwave bands or microwave bands has been remarkable. In those mobile communication devices represented by portable telephones, demands for reduction in size and weight are so great that high-density mounting of electronic components has become the greatest technical problem. Accordingly, since the electronic components, the printed wiring, the inter-module wiring, etc. which are mounted overcrowdedly, approach to each other extremely, and further since the speed-up of the signal processing speed is schemed, the inter-line coupling due to the electrostatic coupling and/or the electromagnetic coupling becomes large and interference due to radiant noise or the like is caused, so that not a few situations have occurred wherein normal operations of the devices are impeded.

Conventionally, against such so-called high-frequency electromagnetic interference, a measure has been mainly taken to apply a conductor shield.

However, since the conductor shield is an electromagnetic interference countermeasure utilizing reflection of electromagnetic waves due to impedance mismatch relative to the space, it can provide a shielding effect but has a drawback to promote the electromagnetic coupling due to reflection from an undesired radiation source. For solving such a drawback, it could be considered effective as a secondary electromagnetic interference countermeasure to use a magnetic loss of a magnetic body, that is, an imaginary part permeability $\mu''$ so as to suppress the undesired radiation.

It has been known that the absorption efficiency of undesired radiation increases corresponding to a magnitude of $\mu''$ in a frequency range where $\mu''>\mu'$. Accordingly, for obtaining a large magnetic loss at a microwave band, it is necessary to realize a characteristic where the real part permeability attenuates due to the magnetic resonance at a VHF band (30 MHz to 300 MHz), a quasi-microwave band (300 MHz to 3 GHz) or a low-frequency side of a microwave band (3 GHz to approximately 10 GHz).

Therefore, it is an object of the present invention to provide a composite magnetic body where the magnetic resonance appears in a range from VHF band to microwave band and, as a result, a magnetic loss at the microwave band is large (that is, an imaginary part permeability $\mu''$ is large). It is another object to provide an electromagnetic interference suppressing body using such a composite magnetic body.

DISCLOSURE OF THE INVENTION

According to the present invention, there is obtained a composite magnetic body characterized in that semi-hard magnetic powder is bonded by an organic bonding agent, and a magnetic resonance appears in a range from VHF band to microwave band.

The foregoing semi-hard magnetic powder is characterized in that a coercive force Hc thereof is 10 to 300 Oe.

The foregoing semi-hard magnetic powder is characterized by having a flat or needle shape and being oriented/aligned in the composite magnetic body.

As a material of the foregoing semi-hard magnetic powder, a magnetic metal alloy, such as Fe—Co—Mo alloy, Co—Fe—Nb alloy or Fe—Co—V alloy, can be cited.

Further, as another material of the foregoing semi-hard magnetic powder, an oxide magnetic body, such as $\gamma$-$Fe_2O_3$ (maghemite) or Co—Ti substituted Ba ferrite, can be cited.

According to the present invention, there is obtained an electromagnetic interference suppressing body using, as a material thereof, the foregoing composite magnetic body, and having a large magnetic lose at a microwave band.

BRIEF DESCRIPTION OF THE DRAWINGS

FIG. 3 is a schematic diagram showing an evaluation system used for characteristic evaluation of an electromagnetic interference suppressing body using a composite magnetic body sample of the present invention.

BEST MODE FOR CARRYING OUT THE INVENTION

Figure 1:
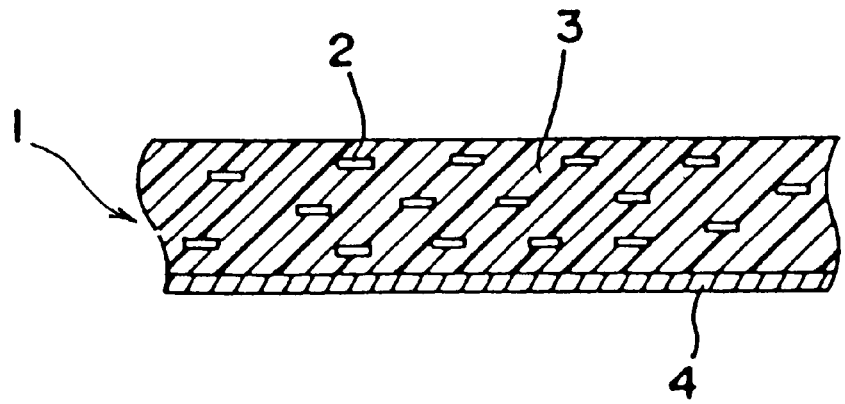
FIG. 1 is a diagram schematically showing a section of a composite magnetic body of the present invention.

In the present invention, a semi-hard magnetic material with a coercive force Hc of 10 to 300 Oe, for example, a metallic magnetic body, such as Fe—Co—Mo alloy, Co—Fe—Nb alloy or Fe—Co—V alloy, or an oxide magnetic body, such as $\gamma$-$Fe_2O_3$ or Co—Ti substituted Ba ferrite, is used as a raw material.

When the raw material is the metallic magnetic body, coarse powder is obtained by a mechanical milling method, an atomizing method or the like, then flattened using a wet mill such as an attriter, and thereafter bonded using an organic bonding agent so as to obtain a composite magnetic body. On the other hand, when the raw material is the oxide magnetic body, flat or needle-shaped fine powder is directly prepared by a crystallizing method, such as a hydrothermal synthesis method or the like, and then bonded using an organic bonding agent so as to obtain a composite magnetic body.

For obtaining a large imaginary part permeability $\mu''$ in the foregoing composite magnetic body, the magnetic powder is flattened or needle-shaped so as to have a thickness equal to or less than a skin depth, an aspect ratio of the flattened or needle-shaped soft magnetic material is set to be approximately not less than 10 for setting a diamagnetic field coefficient Nd to be approximately 1, and the magnetic powder is oriented/aligned in the composite magnetic body. Here, the skin depth $\delta$ is given by the following equation.

$$\delta=(\rho/\pi\mu f)^{1/2}$$

In the foregoing equation, $\rho$ represents resistivity, $\mu$ represents permeability and f represents frequency. Here, although values differ depending on target frequencies, it is one of the easiest means, for obtaining desired skin depth and aspect ratio, to specify the mean particle diameter of the starting material powder when the metallic magnetic body is used.

As typical milling means which can be used for flattening the metallic magnetic material, a ball mill, an attriter, a pin mill, etc. can be cited. As long as the thickness and the aspect ratio of the magnetic powder satisfying the foregoing conditions can be obtained, there is no limitation on the milling means.

Further, for ensuring electrical insulation among individual magnetic powder in the composite magnetic body to give a function as an electrical insulator to the composite magnetic body even in a high-density loading state of the magnetic powder, it is preferable to form dielectric layers on the surfaces of the magnetic powder of an alloy material. The dielectric layers can be realized as oxide layers of metal elements constituting the alloy by oxidizing the surfaces of the metallic magnetic powder. As one example of a means for oxidizing the surfaces of the metallic powder, it is preferable, in view of easiness, stability and safety of a control, to carry out an oxidizing process by a liquid-phase acid removing method or a gas-phase acid removing method which introduces nitrogen-oxygen mixed gas at a controlled oxygen partial pressure in a hydrocarbon organic solvent or an atmosphere of inert gas, particularly for the metallic powder having high activity and relatively small size.

When the oxide magnetic powder is used as the magnetic powder, it is not necessary to be processed by the foregoing surface oxidizing process because it has high electrical resistance per se.

As an organic bonding agent to be used as one constituent component of the composite magnetic body of the present invention, polyester resin, polyethylene resin, polyvinyl chloride resin, polyvinyl butyral resin, polyurethane resin, cellulose resin, ABS resin, nitrile-butadiene rubber, styrene-butadiene rubber, epoxy resin, phenol resin, amide resin, imide resin or copolymers thereof can be cited.

There is no particular limitation on the foregoing means for kneading/dispersing the semi-hard magnetic powder and the organic bonding agent to obtain the composite magnetic body, and a preferable method may be selected using properties of a bonding agent to be used and facility of processes as criteria.

As means of orienting/aligning the magnetic particles in the kneaded/dispersed magnetic mixture, there are a method using a shearing stress and a method using a magnetic field orientation, either of which may be used.

For explaining a structure of the composite magnetic body of the present invention, its section is schematically shown in FIG. 1. Referring to the same figure, a composite magnetic body 1 is formed by dispersing flat semi-hard magnetic particles 2 into a layer of an organic bonding agent 3 and bonding them. On the other hand, 4 denotes a support provided when the strength is required upon handling or when a shield characteristic is required as an electromagnetic interference suppressing body in addition to a high-frequency magnetic loss characteristic. It may be an insulating plate when an improvement in mechanical strength is only aimed. On the other hand, when the shield characteristic is required, it is necessary to consider an electrical characteristic and to select a material excellent in electrical conductivity. A copper plate in FIG. 3, which will be described later, is also used as a shield member with high electrical conductivity.

Hereinbelow, more concrete examples will be described.

First, a plurality of ingots of Fe—Cu—Mo alloy, Co—Fe—Nb alloy and Fe—Co—V alloy were prepared and coarsely milled by a stamp mill, then subjected to grinding processes under various conditions using an attriter. Further, while introducing nitrogen-oxygen mixed gas at a 35% oxygen partial pressure, they were agitated for 8 hours in a hydrocarbon organic solvent and subjected to a liquid-phase acid removing process. Thereafter, a classifying process was carried out to obtain a plurality of flat magnetic powder samples having different coercive forces Hc. As a result of analyzing the surfaces of the obtained powder, the generation of metal oxides was clearly confirmed so that the presence of oxide films on the surfaces of the sample powder was confirmed.

On the other hand, $\gamma$-$Fe_2O_3$ powder and Co—Ti substituted Ba ferrite powder were prepared by the hydrothermal synthesis method so as to obtain oxide magnetic powder samples.

Using these powders, below-described composite magnetic body samples were prepared to examine $\mu$-f characteristics.

For the measurement of the $\mu$-f characteristics, the composite magnetic body samples used were processed into toroidal shapes. By inserting it into a test fixture forming a one-turn coil to measure its impedance, $\mu'$ and $\mu''$ were derived.

[Sample 1]

A semi-hard magnetic paste was prepared which had the following composition, and formed into a film by a doctor blade process. After applying hot pressing thereto, curing was carried out at 85° C. for 24 hours to obtain sample 1.

The obtained sample 1 was analyzed using a scanning electron microscope and it was confirmed that the particle alignment was in an in-surface direction of the sample.

| | |
|---|---|
| Flat semi-hard magnetic body (Fe—Cu—Mo alloy) Fine powder A | 95 weight parts |
| Mean particle diameter: | ø20 $\mu$m × 0.3 $\mu$m$^t$ |
| Coercive force Hc: | 25 Oe |
| Polyurethane resin | 8 weight parts |
| Curing agent (isocyanate compound) | 2 weight parts |
| Solvent (mixture of cyclohexanone and toluene) | 40 weight parts |

[Sample 2]

A semi-hard magnetic paste was prepared which had the following composition, and formed into a film by a doctor blade process. After applying hot pressing thereto, curing was carried out at 85° C. for 24 hours to obtain sample 2.

The obtained sample 2 was analyzed using a scanning electron microscope and it was confirmed that the particle alignment was in an in-surface direction of the sample.

| | |
|---|---|
| Flat semi-hard magnetic body (Co—Fe—Nb alloy) Fine powder B | 95 weight parts |
| Mean particle diameter: | ø20 $\mu$m × 0.3 $\mu$m$^t$ |
| Coercive force Hc: 32 Oe | |
| Polyurethane resin | 8 weight parts |
| Curing agent (isocyanate compound) | 2 weight parts |
| Solvent (mixture of cyclohexanone and toluene) | 40 weight parts |

[Sample 3]

A semi-hard magnetic paste was prepared which had the following composition, and formed into a film by a doctor blade process. After applying hot pressing thereto, curing was carried out at 85° C. for 24 hours to obtain sample 3.

The obtained sample 3 was analyzed using a scanning electron microscope and it was confirmed that the particle alignment was in an in-surface direction of the sample.

| | |
|---|---|
| Flat semi-hard magnetic body (Fe—Co—V alloy) Fine powder C | 95 weight parts |
| Mean particle diameter: | ø30 μm × 0.4 μm$^t$ |
| Coercive force Hc: | 130 Oe |
| Polyurethane resin | 8 weight parts |
| Curing agent (isocyanate compound) | 2 weight parts |
| Solvent (mixture of cyclohexanone and toluene) | 40 weight parts |

[Sample 4]

A semi-hard magnetic paste was prepared which had the following composition, and formed into a film by a doctor blade process. After drying it in a magnetic field in an in-surface direction of a sample, hot pressing was applied thereto and curing was carried out at 85° C. for 24 hours to obtain sample 4.

The obtained sample 4 was analyzed using a vibrating type magnetometer and it was confirmed that a magnetization easy axis was in an in-surface direction of the sample.

| | |
|---|---|
| Needle-shaped semi-hard magnetic body (γ-Fe$_2$O$_3$) Fine powder D | 95 weight parts |
| Mean particle diameter: | ø0.1 × 0.8 μm$^t$ |
| Coercive force Hc: | 270 Oe |
| Polyurethane resin | 8 weight parts |
| Curing agent (isocyanate compound) | 2 weight parts |
| Solvent (mixture of cyclohexanone and toluene) | 40 weight parts |

[Sample 5]

A semi-hard magnetic paste was prepared which had the following composition, and formed into a film by a doctor blade process. After drying it in a magnetic field in an in-surface direction of a sample, hot pressing was applied thereto and curing was carried out at 85° C. for 24 hours to obtain sample 5.

The obtained sample 5 was analyzed using a scanning electron microscope and it was confirmed that the particle alignment was in a direction perpendicular to an in-surface direction of the sample, and it was further analyzed using a vibrating type magnetometer and it was confirmed that a magnetization easy axis was in the in-surface direction of the sample.

| | |
|---|---|
| Flat semi-hard magnetic body (Co—Ti substituted Ba ferrite) Fine powder E | 95 weight parts |
| Mean particle diameter: | ø1 μm × 0.3 μm$^t$ |
| Coercive force Hc: | 295 Oe |
| Polyurethane resin | 8 weight parts |
| Curing agent (isocyanate compound) | 2 weight parts |
| Solvent (mixture of cyclohexanone and toluene) | 40 weight parts |

Magnetic resonance frequencies fr and imaginary part permeabilities μ" measured with respect to the foregoing respective samples are shown in Table 1 below.

TABLE 1

| | Magnetic Resonance Frequency fr | Imaginary Part Permeability μ" |
|---|---|---|
| Sample 1 | 80 MHz | 4.1 |
| Sample 2 | 90 MHz | 3.5 |
| Sample 3 | 400 MHz | 2.3 |
| Sample 4 | 850 MHz | 1.5 |
| Sample 5 | 1.1 GHz | 1.3 |

Figure 2:
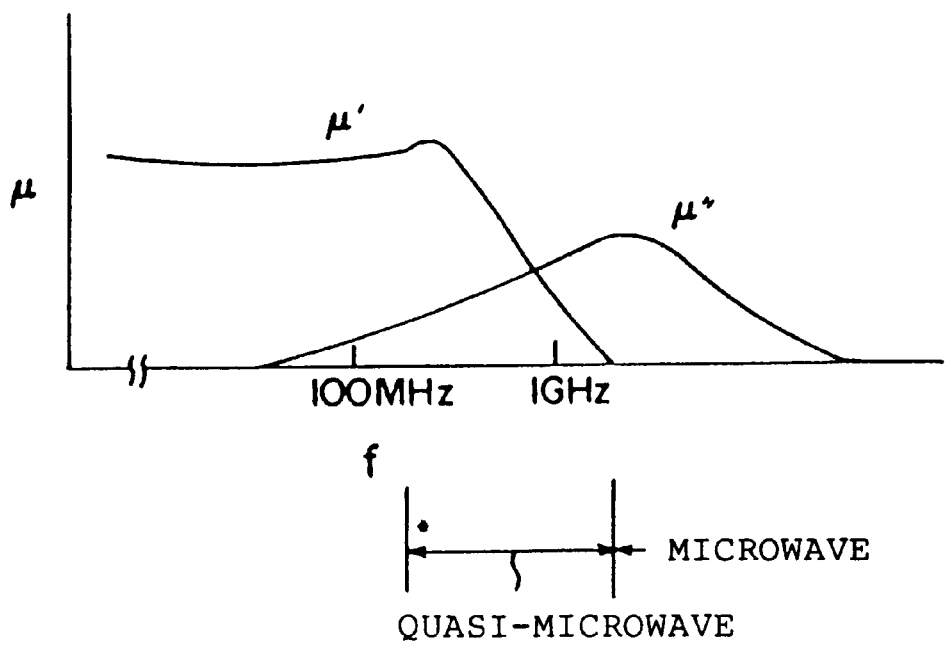
FIG. 2 is a diagram showing $\mu$-f characteristics of sample 1 and sample 4 of a composite magnetic body according to the present invention.

FIG. 2 shows μ-f characteristics of sample 1 and sample 4. The other samples exhibited characteristics approximately within these frequency ranges.

As seen from the foregoing Table 1 and FIG. 2, according to the present invention, there can be obtained the composite magnetic materials with high magnetic losses at the microwave band.

Using the foregoing samples, electromagnetic interference suppressing effects thereof were measured using an evaluation system as shown in FIG. 3.

Here, a composite magnetic body sample 10 having a thickness of 2 mm and a length of each side being 20 cm was backed with a copper plate 11 so as to prepare an electromagnetic interference suppressing body sample. An electromagnetic wave was radiated to the sample from an electromagnetic wave generator 12 via a micro-loop antenna 13 having a loop diameter of 1 mm, and a reflected wave from the electromagnetic interference suppressing body sample was received at an antenna 14 of the same size and shape so as to measure the strength of the reflected wave by a network analyzer (electromagnetic field strength measuring device) 15.

The results are shown in Table 2 along with the surface resistances.

TABLE 2

| | Sample 1 | Sample 4 |
|---|---|---|
| Surface Resistance (×10$^7$Ω) | 5.8 | 4.3 |
| Signal Attenuation (dB) (at 8 GHz) | 7.9 | 5.7 |

Here, the surface resistances are measured values according to the ASTM-D-257 method. Values of the electromagnetic interference suppressing effect represent signal attenuation when the copper plate is set to a reference (0 dB).

From the foregoing Table 2, the following effects are evident.

Specifically, according to the composite magnetic body of the present invention, the value of the surface resistance is 10$^7$ to 10$^8$Ω. Therefore, by using the magnetic powder oxidized at least on the surfaces thereof, the high insulation can be given to the composite magnetic body so that the surface reflection of the electromagnetic waves due to impedance mismatch as observed with respect to the conductor, the bulk metallic magnetic body or the like, can be suppressed.

Further, it is understood that the composite magnetic body of the present invention has the excellent electromagnetic interference suppressing effect at the microwave band.

As described above, according to the present invention, there can be obtained the composite magnetic body in the form of the semi-hard magnetic powder bonded by the organic bonding agent, which has the high magnetic loss at the microwave band and thus can suppress the electromagnetic waves at the microwave band. Therefore, using this composite magnetic body, the thin electromagnetic interference suppressing body effective at the microwave band can be obtained.

Industrial Applicability

The flexibility can be easily given to the composite magnetic body and the electromagnetic interference suppressing body of the present invention as seen from the constituent components thereof. Thus, it is possible to deal with a complicated shape or strict requirements for vibration and shock resistance.

We claim:

1. An electromagnetic interference suppressing body characterized in that a semi-hard magnetic powder is bonded by and dispersed through an organic bonding agent, said magnetic powder being selected from the group consisting of alloys of Fe—Co—Mo, Co—Fe—Nb and Fe—Co—V, said body having a magnetic resonance of VHF band and to microwave band.

2. The electromagnetic interference suppressing body as in claim 1 characterized in that a coercive force Hc of said body ranges from about 10 to 300 Oe.

3. The electromagnetic interference suppressing body as in claim 1 characterized in that said semi-hard magnetic powder has a flat or needle shape and is oriented/aligned in said magnetic body.

4. The electromagnetic interference suppressing body as in claim 1, wherein said magnetic powder is Fe—Co—Mo magnetic powder.

5. The electromagnetic interference suppressing body as in claim 1, wherein said magnetic powder is Co—Fe—Nb alloy.

6. The electromagnetic interference suppressing body as in claim 1, wherein said magnetic powder is Fe—Co—V alloy.

* * * * *